(12) United States Patent
LV

(10) Patent No.: US 11,196,028 B2
(45) Date of Patent: Dec. 7, 2021

(54) FLEXIBLE OLED DISPLAY WITH INTERNAL REFLECTIVE COMPONENT

(71) Applicant: Wuhan China Star Optoelectronics Semiconductor Display Technology Co., LTD., Wuhan (CN)

(72) Inventor: Linhong LV, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 494 days.

(21) Appl. No.: 16/307,127

(22) PCT Filed: Sep. 21, 2018

(86) PCT No.: PCT/CN2018/106839
§ 371 (c)(1),
(2) Date: Dec. 4, 2018

(87) PCT Pub. No.: WO2020/037758
PCT Pub. Date: Feb. 27, 2020

(65) Prior Publication Data
US 2021/0226168 A1  Jul. 22, 2021

(30) Foreign Application Priority Data
Aug. 21, 2018 (CN) .......................... 201810954121.8

(51) Int. Cl.
*H01L 51/52* (2006.01)
*H01L 27/32* (2006.01)

(52) U.S. Cl.
CPC ...... *H01L 51/5271* (2013.01); *H01L 51/5275* (2013.01); *H01L 27/3244* (2013.01); *H01L 51/5253* (2013.01); *H01L 2251/5338* (2013.01)

(58) Field of Classification Search
CPC ............. H01L 51/5271; H01L 51/5275; H01L 27/3244; H01L 2251/5338; H01L 51/5253
(Continued)

(56) References Cited

U.S. PATENT DOCUMENTS 10,437,064 B2 * 10/2019 Popovich ............. G02B 6/0076
2015/0001483 A1    1/2015 Namkung et al.
(Continued)

FOREIGN PATENT DOCUMENTS

CN  103336596 A  10/2013
CN  106158903 A  11/2016
(Continued)

*Primary Examiner* — Robert T Huber
(74) *Attorney, Agent, or Firm* — Kirton McConkie; Evan R. Witt

(57) ABSTRACT

The present invention provides an OLED display panel and a display device. The OLED display panel includes a luminescent substrate having a first luminescent region and a bending region, and an encapsulated thin film being disposed on the luminescent substrate. The encapsulated thin film disposes a first optical device therein. The projection of the first optical device on the luminescent substrate is at the junction of the first luminescent region and the bending region, to make light from the first luminescent region enter into the bending region by aid of the first optical device.

16 Claims, 3 Drawing Sheets

(58) Field of Classification Search
USPC .............................. 257/40, 88, 98, E51.021
See application file for complete search history.

(56) References Cited

U.S. PATENT DOCUMENTS

| | | |
|---|---|---|
| 2016/0035759 A1 | 2/2016 | Kwon et al. |
| 2016/0118616 A1* | 4/2016 | Hiroki ................. H01L 51/0097 257/40 |
| 2017/0222178 A1 | 8/2017 | Kang et al. |
| 2017/0256692 A1* | 9/2017 | Van Bommel .......... H01L 33/24 |
| 2018/0175311 A1* | 6/2018 | Jin ...................... H01L 27/3258 |

FOREIGN PATENT DOCUMENTS

| | | |
|---|---|---|
| CN | 106575664 A | 4/2017 |
| CN | 107656397 A | 2/2018 |

* cited by examiner

FLEXIBLE OLED DISPLAY WITH INTERNAL REFLECTIVE COMPONENT

BACKGROUND OF THE INVENTION

1. Field of the Invention

The present invention relates to a display technology field, and more particularly to an OLED display panel and a display device.

2. Description of the Prior Art

At present, an organic light-emitting diodes (OLED) is one of the most competitive technologies in the new generation of display devices due to their advantages of wide color gamut, high contrast, energy saving and folding. Especially, the foldable flexible display technology is more concerned and favored by people. It will be widely used in the future, such as intelligent wearing equipment, vehicle-mounted equipment and household appliances and other fields.

In the current design of a flexible OLED display device, it is necessary to bend a part of the display region to form a bending region. However, there may be blind area in the bending region, which affects the display effect.

BRIEF SUMMARY OF THE INVENTION

The main technical problem to be solved in the present invention is how to avoid a blind area in a bending region to improve the display effect.

In a first aspect, the present invention provides an OLED display panel, which comprises: a luminescent substrate including a first luminescent region and a bending region, and an encapsulated thin film being disposed on the luminescent substrate. Wherein the encapsulated thin film is provided with a first optical device therein; and the projection of the first optical device on the luminescent substrate is at the junction of the first luminescent region and the bending region, to make light from the first luminescent region enter into the bending region by aid of the first optical device. The luminescent substrate further includes a second luminescent region; and the encapsulated thin film is providing with a second optical device therein. Wherein the second optical device is spaced from the first optical device; and the projection of the second optical device on the luminescent substrate is at the junction of the second luminescent region and the bending region to make light from the second luminescent region enter into the bending region by aid of the second optical device. Wherein the shape and the size of the first and second optical devices are the same.

In the OLED display panel of the present invention, the first optical device includes an enhancement part and a reflection part; the reflection part is attached to the enhancement part; and the projection of the reflection part on the luminescent substrate is at the first luminescent region.

In the OLED display panel of the present invention, the enhancement part is made of high transmittance material.

In the OLED display panel of the present invention, the enhancement part includes a first side, a second side, a third side and a fourth side; the first side is opposite to the second side; and the third and the fourth sides are between the first and the second sides; wherein the reflection part is attached to the third side, and the projection of the third side on the luminescent substrate is at the first luminescent region.

In the OLED display panel of the present invention, the angle between the third side and the second side is between 0 degrees and 90 degrees.

In the OLED display panel of the present invention, the encapsulated thin film is further provided with a lens therein. Wherein the projection of the lens on the luminescent substrate is at the bending region; and the lens is disposed between the first optical device and the second optical device.

In the OLED display panel of the present invention, the encapsulated thin film includes a first inorganic layer, an organic layer and a second inorganic layer, which are stacked; wherein the first optical device and the second optical device are arranged in the organic layer at intervals; the lens is disposed in the second inorganic layer; and the projections of the first and the second optical devices on the luminescent substrate are not coincided with the projection of the lens on the luminescent substrate.

In a second aspect, the present invention provides an OLED display panel, which comprises: a luminescent substrate including a first luminescent region and a bending region, and an encapsulated thin film being disposed on the luminescent substrate. Wherein the encapsulated thin film is provided with a first optical device therein; the projection of the first optical device on the luminescent substrate is at the junction of the first luminescent region and the bending region to make light from the first luminescent region enter into the bending region by aid of the first optical device.

In the OLED display panel of the present invention, the first optical device includes an enhancement part and a reflection part; the reflection part is attached to the enhancement part; and the projection of the reflection part on the luminescent substrate is at the first luminescent region.

In the OLED display panel of the present invention, the reflection part is made of silver or indium tin oxide material.

In the OLED display panel of the present invention, the enhancement part is made of high transmittance material.

In the OLED display panel of the present invention, the enhancement part includes a first side, a second side, a third side and a fourth side; the first side is opposite to the second side; and the third and the fourth sides are between the first and the second sides; wherein the reflection part is attached to the third side, and the projection of the third side on the luminescent substrate is at the first luminescent region.

In the OLED display panel of the present invention, the angle between the third side and the second side is between 0 degrees and 90 degrees.

In the OLED display panel of the present invention, the luminescent substrate further includes a second luminescent region; and the encapsulated thin film is further providing with a second optical device therein; wherein the second optical device is spaced from the first optical device; and the projection of the second optical device on the luminescent substrate is at the junction of the second luminescent region and the bending region to make light from the second luminescent region enter into the bending region by aid of the second optical device.

In the OLED display panel of the present invention, the encapsulated thin film is further provided with a lens therein. Wherein the projection of the lens on the luminescent substrate is at the bending region; and the lens is disposed between the first optical device and the second optical device.

In the OLED display panel of the present invention, the encapsulated thin film includes a first inorganic layer, an organic layer and a second inorganic layer, which are stacked; wherein the first optical device and the second optical device are arranged in the organic layer at intervals; the lens is disposed in the second inorganic layer; and the projections of the first and the second optical devices on the luminescent substrate are not coincided with the projection of the lens on the luminescent substrate.

In the OLED display panel of the present invention, the lens is a convex lens.

In a third aspect, the present invention provides a display device, which includes an OLED display panel. The OLED display panel comprises: a luminescent substrate including a first luminescent region and a bending region, an encapsulated thin film being disposed on the luminescent substrate. Wherein the encapsulated thin film is provided with a first optical device therein; the projection of the first optical device on the luminescent substrate is at the junction of the first luminescent region and the bending region to make light from the first luminescent region enter into the bending region by aid of the first optical device.

In the OLED display panel of the present invention, the luminescent substrate further includes a second luminescent region; and the encapsulated thin film is further providing with a second optical device therein; wherein the second optical device is spaced from the first optical device; and the projection of the second optical device on the luminescent substrate is at the junction of the second luminescent region and the bending region to make light from the second luminescent region enter into the bending region by aid of the second optical device.

The beneficial effect of the present invention is that: the first optical device is disposed, and the projection of the first optical device on the luminescent substrate is at the junction of the first luminescent region and the bending region. When the OLED display panel works, the light from the first luminescent region can enter into the bending region by aid of the first optical device, thereby solving the problem of a blind area in the bending region and improving the display effect.

DETAILED DESCRIPTION OF THE PREFERRED EMBODIMENTS

The following text will describe embodiments of the present invention in detailed. The embodiments are shown in the accompanying drawings, in which the same or similar signs represent the same or similar elements or elements with the same or similar functions from beginning to end. The following embodiments described with reference to the accompanying drawings are illustrative and are intended only to explain the present invention and are not understood as limitations to the invention.

Figure 1:
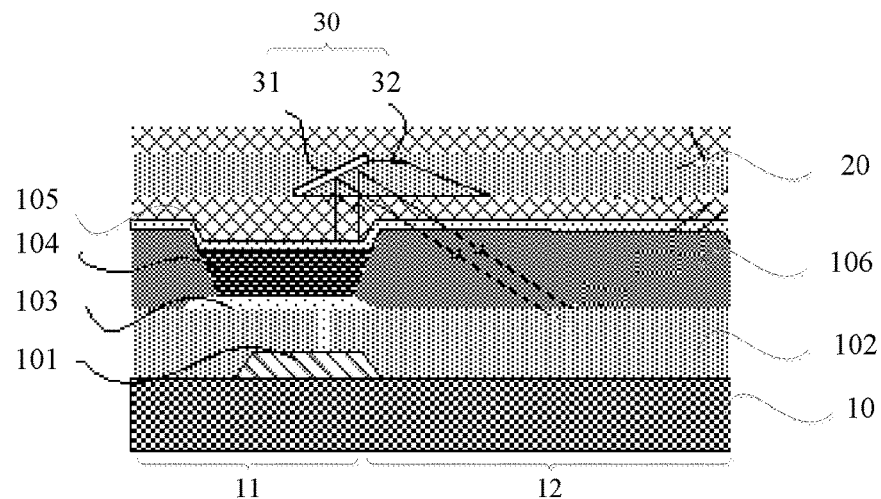
FIG. 1 is a sectional schematic view of an OLED display panel provided by the embodiment of the present invention.

Please refer to FIG. 1, FIG. 1 is a sectional schematic view of an OLED display panel provided by the embodiment of the present invention.

One embodiment of the present invention provides an OLED display panel, which comprises:

a luminescent substrate 10, including a first luminescent region 11 and a bending region 12; and an encapsulated thin film 20, being disposed on the luminescent substrate 10;

wherein the encapsulated thin film 20 is provided with a first optical device 30 therein; the projection of the first optical device 30 on the luminescent substrate 10 is at the junction of the first luminescent region 11 and the bending region 12 to make light from the first luminescent region 11 enter into the bending region 12 by aid of the first optical device 30.

Specifically, the luminescent substrate 10 may include a metal wire 101 (Source-Drain wire), a flat layer 102, an anode 103, an organic luminescent layer 104, a cathode 105 and a pixel definition layer 106. The encapsulated thin film 20 is disposed on the luminescent substrate 10 and can be prepared by a CVD (Chemical Vapor Deposition) process. The encapsulated thin film 20 disposes the first optical device 30 therein. When the OLED display panel works, because the projection of the first optical device 30 on the luminescent substrate 10 is at the junction of the first luminescent region 11 and the bending region 12, one part of the light from the first luminescent region 11 can enter into the bending region 12 by aid of the first optical device 30, thereby making the bending region 12 luminescent and further improving the display effect of the bending region 12.

Optionally, please continue to see FIG. 1, in some embodiments, the first optical device 30 includes a reflection part 31 and an enhancement part 32. The reflection part 31 is attached to the enhancement part 32, and the projection of the reflection part 31 on the luminescent substrate 10 is at the first luminescent region 11.

Specifically, the first optical device 30 includes the reflection part 31 and the enhancement part 32. When the OLED display panel works, the light from the first luminescent region 11 can be reflected by the reflection part 31 to form a reflected light. The reflected light can pass through the enhancement part 32 and enter into the bending region 12, thereby making the bending region 12 luminescent and further improving the display effect of the bending region 12.

It should be noted that, the enhancement part 32 is made of high transmittance material, and the first optical device 30 is disposed in the encapsulated thin film 20. When the light from the first luminescent region 11 is reflected by the first optical device 30 into the bending region 12, the intensity of the reflected light is necessarily much weaker than that of the light of the first luminescent region 11 because the light transmittance of the encapsulated thin film 20 is inconsistent. But in the present invention, the reflection part 31 is attached to the enhancement part 32, thereby reducing the weakening of the reflected light due to the encapsulated thin film 20.

Preferably, the reflection part 31 is made of silver or indium tin oxide material.

Further, please continue to see FIG. 1, in some embodiments, the enhancement part 31 has a first side, a second side, a third side and a fourth side. The first side is opposite to the second side. The third and the fourth sides are between the first and the second sides.

Wherein the reflection part 31 is attached to the third side, and the projection of the third side on the luminescent substrate is at the first luminescent region.

Optionally, the angle between the third side and the second side is between 0 degrees and 90 degrees. It should be noted that, the angle between the reflection part 31 and the second side can be adjusted by adjusting the angle between the third side and the second side, thereby being capable of adjusting the intensity of the reflected light, which is from the reflection part 31 to the bending region 12. This can be set according to the actual situation.

Figure 2:
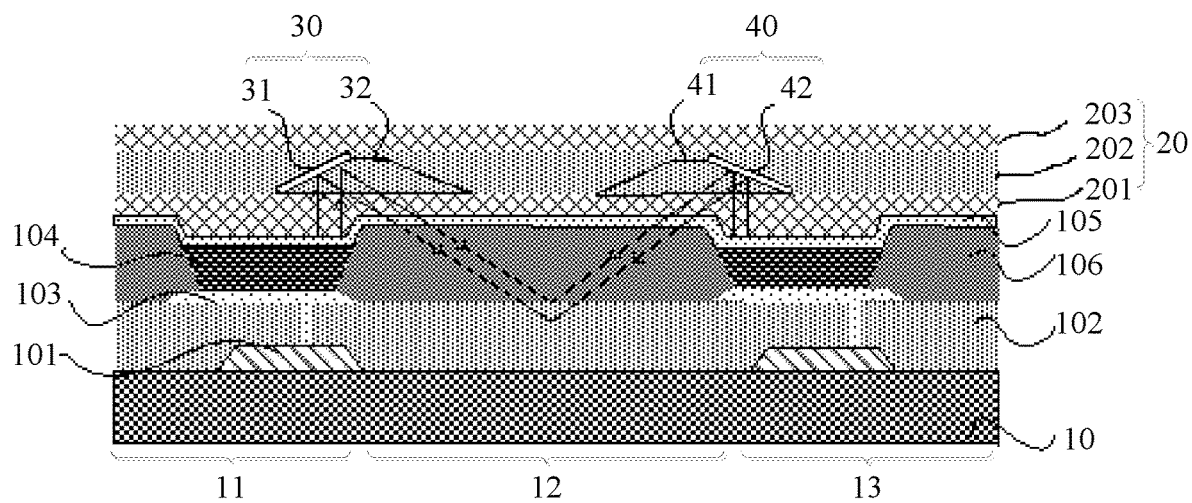
FIG. 2 is a sectional schematic view of the OLED display panel provided by one preferred embodiment of the present invention in an unfolding state.
Figure 3:
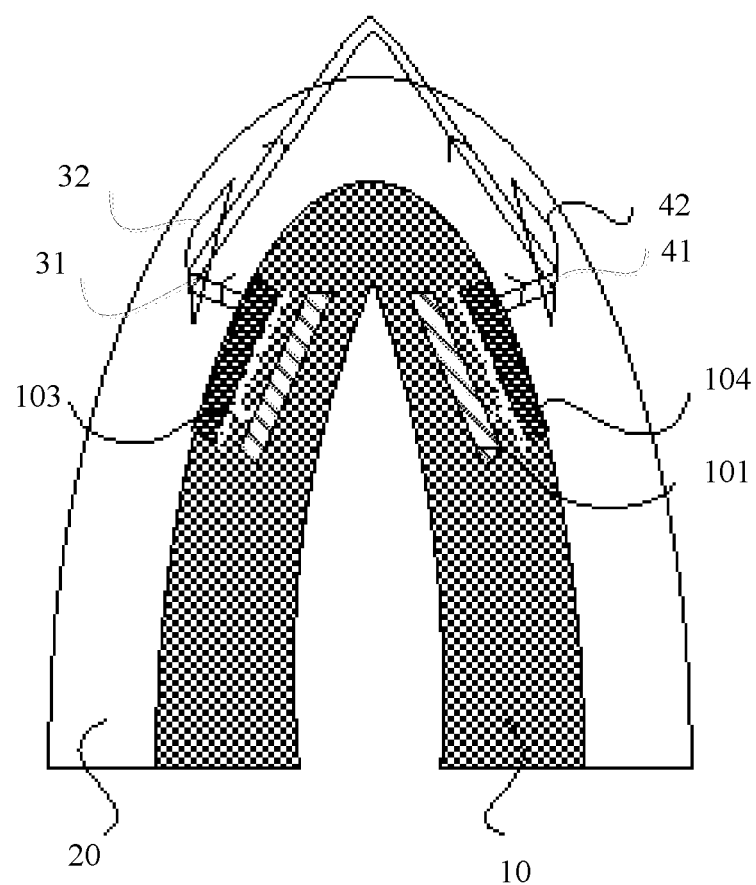
FIG. 3 is a sectional schematic view of the OLED display panel provided by one preferred embodiment of the present invention in a bending state.

Next, please refer to FIGS. 2 and 3, FIG. 2 is a sectional schematic view of the OLED display panel provided by one preferred embodiment of the present invention in an unfolding state; and FIG. 3 is a sectional schematic view of the OLED display panel provided by one preferred embodiment of the present invention in a bending state.

In some embodiments, the luminescent substrate 10 further includes a second luminescent region 13, and the encapsulated thin film 20 is further provided with a second optical device 40 therein.

The second optical device 40 is spaced from the first optical device 30. The projection of the second optical device 40 on the luminescent substrate 10 is at the junction of the second luminescent region 13 and the bending region 12 to make light from the second luminescent region 13 enter into the bending region 12 by aid of the second optical device 40.

Specifically, the first optical device 30 and the second optical device 40 are arranged at intervals in the encapsulated thin film 20. When the OLED display panel works, one part of the light from the first luminescent region 11 can enter into the bending region 12 by aid of the second optical device 40, so the bending region 12 can simultaneously receive one part of the light of the first luminescent region 11 and one part of the light of the second luminescent region 13, thereby further improving the display effect of the bending region 12. Because the structure of the second optical device 40 is similar to that of the first optical device 30, the specific structure thereof can be referred to the preceding description, and no more details here.

Preferably, the shape and the size of the first optical device 30 and the second optical devices 40 are the same.

Figure 4:
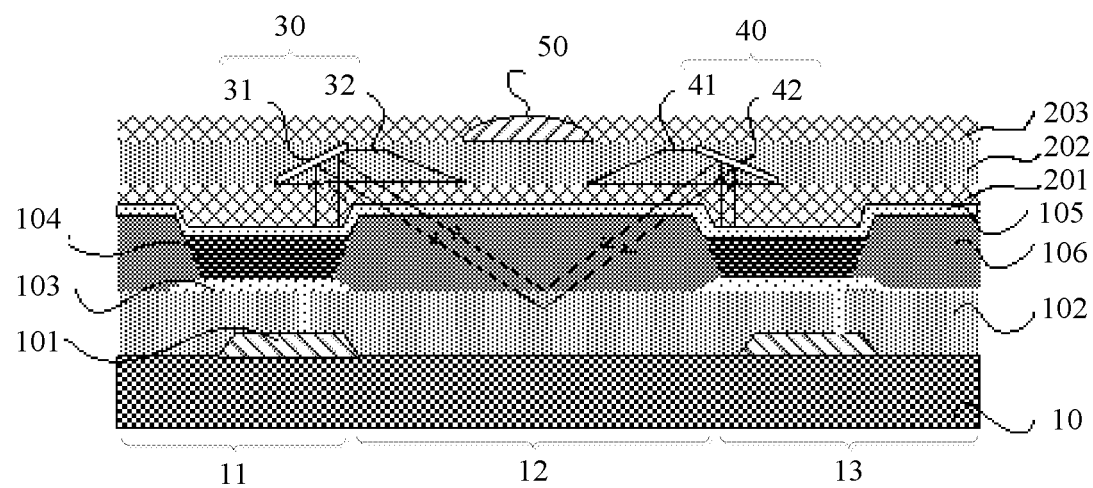
FIG. 4 is a sectional schematic view of the OLED display panel provided by the other preferred embodiment of the present invention in an unfolding state.
Figure 5:
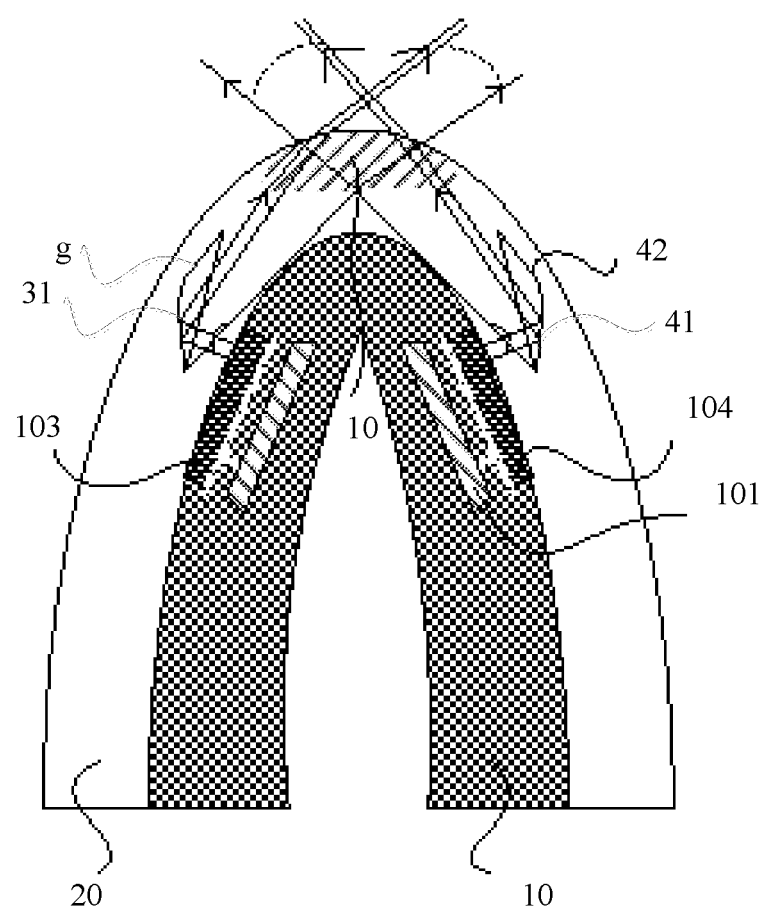
FIG. 5 is a sectional schematic view of the OLED display panel provided by the other preferred embodiment of the present invention in a bending state.

Optionally, in some embodiments, please refer to FIGS. 4 and 5, FIG. 4 is a sectional schematic view of the OLED display panel provided by the other preferred embodiment of the present invention in an unfolding state, and FIG. 5 is a sectional schematic view of the OLED display panel provided by the other preferred embodiment of the present invention in a bending state.

The encapsulated thin film 20 is further provided with a lens 50 therein.

The projection of the lens 50 on the luminescent substrate 10 is at the bending region 12. And the lens 50 is disposed between the first optical device 30 and the second optical device 40.

Preferably, the lens 50 is a convex lens, which is disposed between the first optical device 30 and the second optical device 40. When the OLED display panel works, the lens 50 can make the display angle be wider, thereby improving the display effect of the bending region 12, and further improving the display effect of the OLED display panel.

Further, please continue to refer to FIG. 4, in some embodiments, the encapsulated thin film 20 may include a first inorganic layer 201, an organic layer 202 and a second inorganic layer 203, which are stacked.

Wherein the first optical device and the second optical device are arranged in the organic layer at intervals; the lens is disposed in the second inorganic layer; and the projections of the first and the second optical devices on the luminescent substrate are not coincided with the projection of the lens on the luminescent substrate.

Correspondingly, the present invention also provides a display device, including the OLED display panel of any one embodiment of the present invention.

In the embodiment, the encapsulated thin film 20 disposes the first optical device 30 and the second optical device at intervals. When the OLED display panel works, the light from the first luminescent region 11 can enter into the bending region 12 by the first optical device 30, and the light from the second luminescent region 13 can enter into the bending region 12 by the second optical device 40, thereby avoiding a blind area in the bending region to improve the display effect.

The above description of the OLED display panel and the display device provided by the embodiments of the present invention is described in detail. In above text, the principles and implementation mode of the present invention are expounded with specific examples, and above specific examples are only for helping to understand the invention. Moreover, for those of ordinary skill in the art, there will be changes in the specific implementation and application scope according to the ideas of the present invention. In summary, the content of this specification should not be understood as a limitation to the present invention.

What is claimed is:

1. An OLED display panel, which comprises:
   a luminescent substrate, including a first luminescent region, a second luminescent region, and a bending region; and
   an encapsulated thin film, being disposed on the luminescent substrate;
   wherein the encapsulated thin film is provided with a first optical device, a second optical device, and a lens therein; the projection of the first optical device on the luminescent substrate is at the junction of the first luminescent region and the bending region to make light from the first luminescent region enter into the bending region by aid of the first optical device, and the projection of the lens on the luminescent substrate is at the bending region; and the lens is disposed between the first optical device and the second optical device;
   wherein the second optical device is spaced from the first optical device; and the projection of the second optical device on the luminescent substrate is at the junction of the second luminescent region and the bending region to make light from the second luminescent region enter into the bending region by aid of the second optical device; and
   wherein the shape and the size of the first and second optical devices are the same.

2. The OLED display panel as claimed in claim 1, wherein the first optical device includes an enhancement part and a reflection part; the reflection part is attached to the enhancement part; and the projection of the reflection part on the luminescent substrate is at the first luminescent region.

3. The OLED display panel as claimed in claim 2, wherein the reflection part is made of silver or indium tin oxide material.

4. The OLED display panel as claimed in claim 2, wherein the enhancement part is made of high transmittance material.

5. The OLED display panel as claimed in claim 1, wherein the enhancement part includes a first side, a second side, a third side and a fourth side; the first side is opposite to the second side; and the third and the fourth sides are between the first and the second sides;

wherein the reflection part is attached to the third side, and the projection of the third side on the luminescent substrate is at the first luminescent region.

6. The OLED display panel as claimed in claim 5, wherein the angle between the third side and the second side is between 0 degrees and 90 degrees.

7. The OLED display panel as claimed in claim 1, wherein the encapsulated thin film includes a first inorganic layer, an organic layer and a second inorganic layer, which are stacked;

wherein the first optical device and the second optical device are arranged in the organic layer at intervals; the lens is disposed in the second inorganic layer; and the projections of the first and the second optical devices on the luminescent substrate are not coincided with the projection of the lens on the luminescent substrate.

8. An OLED display panel, which comprises:

a luminescent substrate, including a first luminescent region, a second luminescent region, and a bending region; and an encapsulated thin film, being disposed on the luminescent substrate;

wherein the encapsulated thin film is provided with a first optical device, a second optical device, and a lens therein; the projection of the first optical device on the luminescent substrate is at the junction of the first luminescent region and the bending region to make light from the first luminescent region enter into the bending region by aid of the first optical device, and the projection of the lens on the luminescent substrate is at the bending region; and the lens is disposed between the first optical device and the second optical device, and wherein the second optical device is spaced from the first optical device; and the projection of the second optical device on the luminescent substrate is at the junction of the second luminescent region and the bending region to make light from the second luminescent region enter into the bending region by aid of the second optical device.

9. The OLED display panel as claimed in claim 8, wherein the first optical device includes an enhancement part and a reflection part; the reflection part is attached to the enhancement part; and the projection of the reflection part on the luminescent substrate is at the first luminescent region.

10. The OLED display panel as claimed in claim 9, wherein the reflection part is made of silver or indium tin oxide material.

11. The OLED display panel as claimed in claim 9, wherein the enhancement part is made of high transmittance material.

12. The OLED display panel as claimed in claim 9, wherein the enhancement part includes a first side, a second side, a third side and a fourth side; the first side is opposite to the second side; and the third and the fourth sides are between the first and the second sides;

wherein the reflection part is attached to the third side, and the projection of the third side on the luminescent substrate is at the first luminescent region.

13. The OLED display panel as claimed in claim 12, wherein the angle between the third side and the second side is between 0 degrees and 90 degrees.

14. The OLED display panel as claimed in claim 8, wherein the encapsulated thin film includes a first inorganic layer, an organic layer and a second inorganic layer, which are stacked;

wherein the first optical device and the second optical device are arranged in the organic layer at intervals; the lens is disposed in the second inorganic layer; and the projections of the first and the second optical devices on the luminescent substrate are not coincided with the projection of the lens on the luminescent substrate.

15. The OLED display panel as claimed in claim 14, wherein the lens is a convex lens.

16. A display device, characterized in that: the display device includes an OLED display panel, which comprises:

a luminescent substrate, including a first luminescent region and a bending region;

an encapsulated thin film, being disposed on the luminescent substrate;

wherein the encapsulated thin film is provided with a first optical device, a second optical device, and a lens therein; the projection of the first optical device on the luminescent substrate is at the junction of the first luminescent region and the bending region to make light from the first luminescent region enter into the bending region by aid of the first optical device, and the projection of the lens on the luminescent substrate is at the bending region; and the lens is disposed between the first optical device and the second optical device, and wherein the second optical device is spaced from the first optical device; and the projection of the second optical device on the luminescent substrate is at the junction of a second luminescent region and the bending region to make light from the second luminescent region enter into the bending region by aid of the second optical device.

* * * * *